United States Patent [19]

Tielert

[11] Patent Number: 4,734,888

[45] Date of Patent: Mar. 29, 1988

[54] CIRCUIT ARRANGEMENT COMPRISING A MATRIX SHAPED MEMORY ARRANGEMENT FOR VARIABLY ADJUSTABLE TIME DELAY OF DIGITAL SIGNALS

[75] Inventor: Reinhard Tielert, Munich, Fed. Rep. of Germany

[73] Assignee: Siemens Aktiengesellschaft, Berlin and Munich, Fed. Rep. of Germany

[21] Appl. No.: 828,512

[22] Filed: Feb. 12, 1986

[30] Foreign Application Priority Data

Feb. 25, 1985 [DE] Fed. Rep. of Germany ....... 3506603

[51] Int. Cl.⁴ .................................................. G11C 7/00
[52] U.S. Cl. ..................................... 365/194; 365/189
[58] Field of Search ............... 365/189, 190, 194, 195, 365/196, 239, 240

[56] References Cited

U.S. PATENT DOCUMENTS 3,893,088 7/1975 Bell ...................................... 365/240

Primary Examiner—Joseph A. Popek
Attorney, Agent, or Firm—Hill, Van Santen, Steadman & Simpson

[57] ABSTRACT

A circuit arrangement comprising a matrix-shaped memory arrangement for variably adjustable time delay of digital signals contains known three-transistor cells having overlap write/read cycles as storing elements. The arrangement also contains a continuously steppable row selector, resettable at any time, and clock-controlled by the input data clock which comprises, respectively, two mutually phase offset signal outputs per selection step which respectively drive a write word line and a read word line which are provided per row of the matrix. The arrangement further comprises two separate bit lines, a write bit line and a read bit line per column which are respectively interconnected to all memory cells of a column, and comprises a disconnectible storage amplifier per column whose input is connected to the read bit line of the column assigned thereto and whose output is connected to the following column and serves as a data output for the assigned column. The arrangement further comprises a data input for the data signals to be delayed, the data input being connected to the write bit line of the first column and to an undelayed data output, and a reset input which is connected to the setting inputs of a first element of the row selector as well as to the reset inputs of the remaining elements of the row selector. The chronological spacing between reset pulses is selected such that it equals the required delay time which is to be set between the undelayed data output and the first delayed data output.

7 Claims, 5 Drawing Figures

CIRCUIT ARRANGEMENT COMPRISING A MATRIX SHAPED MEMORY ARRANGEMENT FOR VARIABLY ADJUSTABLE TIME DELAY OF DIGITAL SIGNALS

CROSS REFERENCE TO RELATED APPLICATIONS

This application is related to application Ser. No. 831,791 filed Feb. 21, 1986 and application Ser. No. 828,513 filed Feb. 12, 1986.

BACKGROUND OF THE INVENTION

1. Field of the Invention

The present invention relates to a circuit arrangement for variably adjustable time delay of digital signals, the circuit arrangement comprising a matrix-shaped memory arrangement.

2. Description of the Prior Art

Facilities with whose assistance defined time delays of digital data streams can be effected are frequently required in the field of digital signal processing, as well as in the field of communications technology. Defined time delays are employed, for example, for the compensation of transit times. Given a constant number of desired delay clocks, an arrangement comprising a shift register is generally available as a time delay device. When, however, the time delay is to be variably adjustable, then specific problems arise when shift registers are used.

It is also known to delay data streams by an arrangement composed of standard circuits and memory modules. In such an arrangement, the components of the data stream are deposited in a freely addressable memory. This memory is driven by a decoder which is, in turn, driven by one (or more) counters. The duration of the time delay is thereby established by the spacing of the counter reset pulses. Since the memory cells of such a freely addressable memories can only read or write per clock, the necessity thereby occurs of either operating the memories with twice the clock rate or switching back and forth between two memories in a multiplex mode. The first solution of this problem has the advantage that the maximum data clock frequency can only be half as high as the maximum memory cycle frequency. The latter solution requires involved logic circuits for address control and a required reordering of the data. Disadvantages also arise for an integrable construction of such a circuit arrangement because of the high space requirement of the required multiplexers and because of the extensive wiring which is required.

SUMMARY OF THE INVENTION

The object of the present invention is to provide a circuit arrangement of the type initially set forth by means of which defined, variably adjustable time delays can be achieved and which may be realized as an integrated circuit that has a low space requirement and allows data rates that are higher when compared to the prior art. In particular, this object comprises providing a circuit arrangement which is particularly suitable for integration in metal-oxide-semiconductor (MOS) technology.

The above object is achieved, according to the present invention, by the provision of a circuit arrangement for variably adjustable time delay of digital signals which comprises a matrix-shaped memory arrangement in which is particularly characterized in that known three-transistor cells having overlapping write/read cycles are provided as storage elements, in that a continuously steppable row selector which can be reset at any time and which is clocked by the input data clock is provided and comprises two respective, mutually phase offset signal outputs per selection step which respectively drive a write word line or, respectively, a read word line per row of the matrix-shaped memory, in that two separate bit lines are provided per column, namely a write bit line and a read bit line which are respectively interconnected to all memory cells of the column, in that a disconnectible storage amplifier is provided per column and has an input connected to the read bit line of the column assigned thereto and an output connected to the write bit line of the following column and serving as a data output, in that a data input for the data signals to be delayed is connected to the write bit line of the first column and to an undelayed data output, in that a reset input is connected to setting inputs of the first element of the row selector as well as to the reset inputs of the remaining elements of the row selector, and in that the chronological spacing between reset pulses is selected such that it equals the required delay time which is to be set between the undelayed data output and the first delayed data output.

BRIEF DESCRIPTION OF THE DRAWING

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
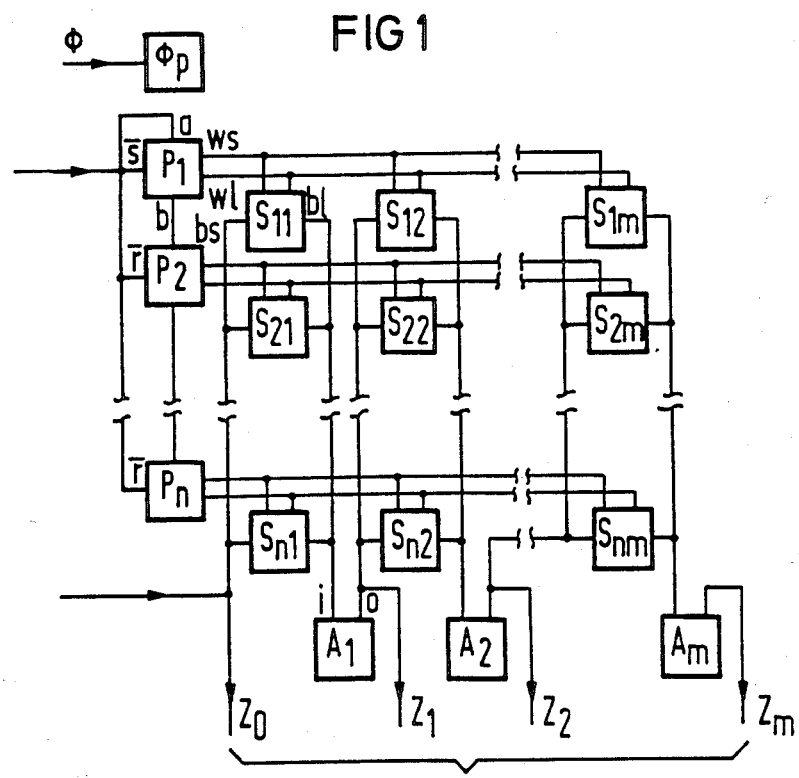
FIG. 1 is a block circuit diagram of a circuit arrangement constructed in accordance with a preferred exemplary embodiment of the invention in which a row selector, a matrix-shaped memory arrangement, regenerator circuits and a clock control are provided.

As already set forth above, FIG. 1 illustrates a preferred exemplary embodiment of a circuit arrangement constructed in accordance with the present invention for variably adjustable time delay of digital signals and comprising a matrix-shaped memory arrangement.

The illustrated circuit arrangement includes a data input D, a reset input $\overline{\text{Reset}}$, a clock input $\phi$ which synchronizes a clock control $\phi_P$, as well as a plurality of data outputs $Z_0 \ldots Z_m$. A row selector having a plurality of stages $P_1 \ldots P_n$ is also provided, wherein the stages in a row are interconnected, wherein the first stage $P_1$ has a setting input $\bar{s}$ and a signal input a and the remaining stages $P_2 \ldots P_n$ have their respective reset inputs r connected to the reset input $\overline{Reset}$, wherein respectively one signal output b is connected to the signal input a of the following stage, and wherein a write word line ws and a read word line wl are respectively provided per stage. Known three-transistor memory cells with overlapping write/read cycles are employed as storage elements in the matrix-shaped arrangement (cf. FIG. 3). The continuously steppable row selector $P_1 \ldots P_n$ which can be reset at any time is clock-controlled by an input data clock. Per selection step, namely per stage, it comprises two signal outputs which are offset in phase relative to one another, namely the write word line ws and, respectively, the read word line wl, which are provided per row of the matrix. Two separate bit lines, namely a write bit line bs and a read bit line bl, are provided per column in the memory arrangement, these being respectively interconnected to all memory cells of a column. Moreover, a disconnectible, storage amplifier $A_1 \ldots A_m$ is provided per column, the input i thereof being connected to the appertaining read bit line bl of a column assigned thereto and the output o thereof being connected to the write bit line bs of the column following thereupon and serving as data outputs $Z_1 \ldots Z_m$ assigned to the respective amplifiers. The data input D for the data signals to be delayed is connected to the write bit line bs of the first column and to an undelayed data output $Z_O$. The further data outputs $Z_1 \ldots Z_m$ are time delayed such in comparison to the undelayed signal output $Z_O$ that the chronological spacing between reset pulses $\overline{Reset}$ is selected such that it equals the required delay time which is to be set between the undelayed data output $Z_O$ and the first time-delayed data output $Z_1$.

Figure 2:
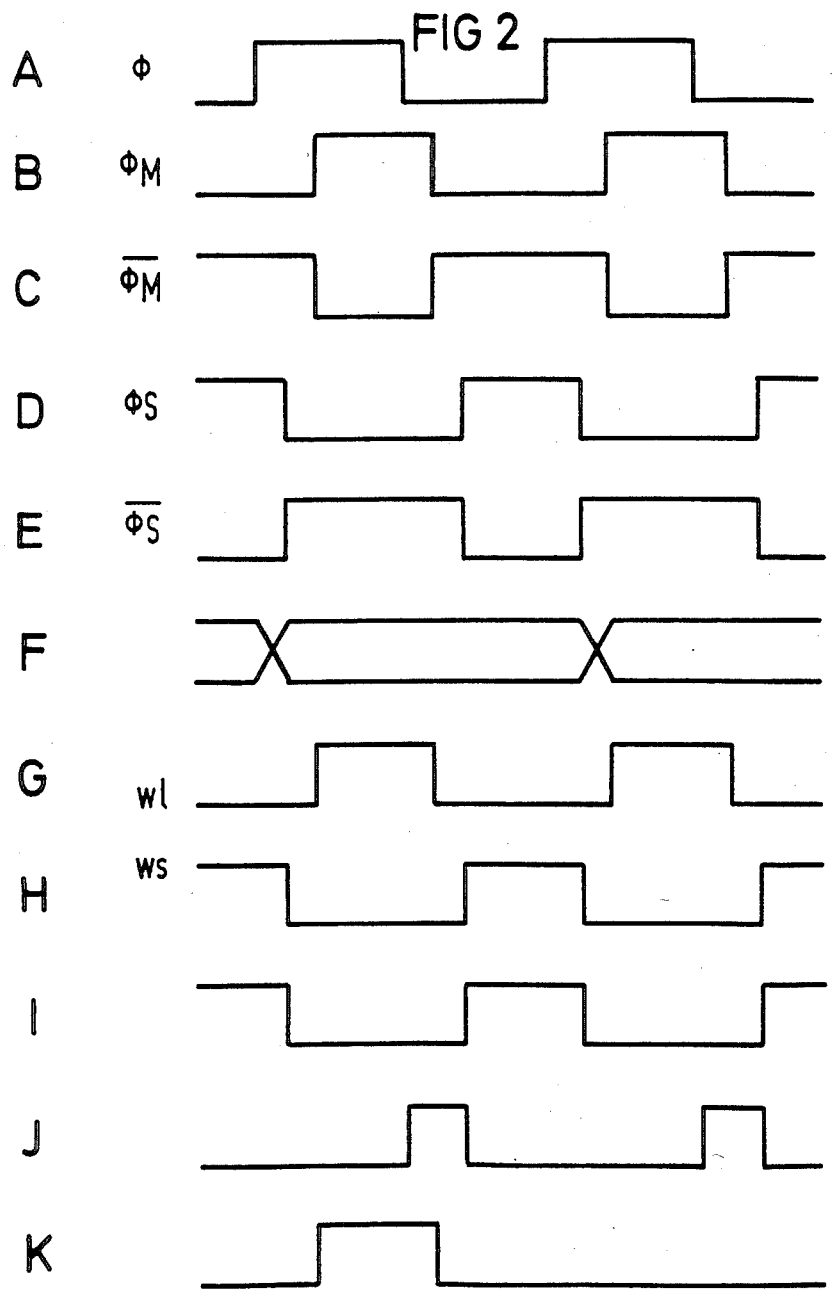
FIG. 2 is a pulse/time diagram which aids in the explanation of the manner of operation of the circuit arrangement of FIG. 1.

As already set forth, FIG. 2 illustrates a pulse/time diagram for explaining the operating mode of the circuit arrangement of FIG. 1.

In FIG. 2, line A illustrates the basic clock $\phi$ applied to the clock control. Auxiliary clocks derived therefrom the control of the row selector (cf. FIG. 5), namely $\phi_M$, $\overline{\phi}_M$, $\phi_S$ and $\overline{\phi}_S$ are illustrated in lines B, C, D and E, respectively. In line F, the phase relation of the input data stream with reference to the basic clock $\phi$ is illustrated. Lines G and H illustrate the output signals of the row selector, namely the read word line signal wl and, respectively, the write word line signal ws. Lines I and J illustrate a precharge signal and, respectively, a hold signal which are employed for the control of the regenerator circuits (cf. FIG. 4). Line K, finally, illustrates the phase relation of the required reset signal with respect to the basic clock $\phi$.

Figure 3:
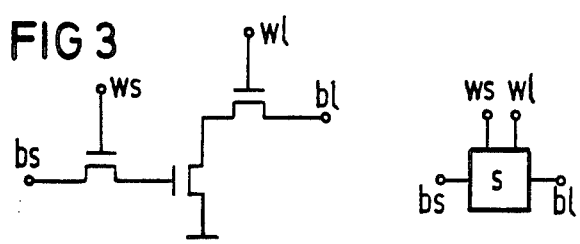
FIG. 3 is a symbolic representation employed in FIG. 1 and a fundamental circuit diagram of a three-transistor memory cell as employed in $n \times m$-fold in the memory arrangement of FIG. 1.

As already set forth, FIG. 3 illustrates a three-transistor cell which may be employed in practicing the present invention, the principle thereof being based on the fact that the information to be stored is dynamically stored at the gate of an MOS transistor (the middle of three transistors). As indicated by the terminal designations, this known three-transistor memory cell is employed in a specific operating mode wherein separate bit lines are used for reading and writing (cf. FIG. 1), whereby the possibility of reading and writing in a single clock cycle occurs, this advantageously leading to the desired saving of time.

Figure 4:
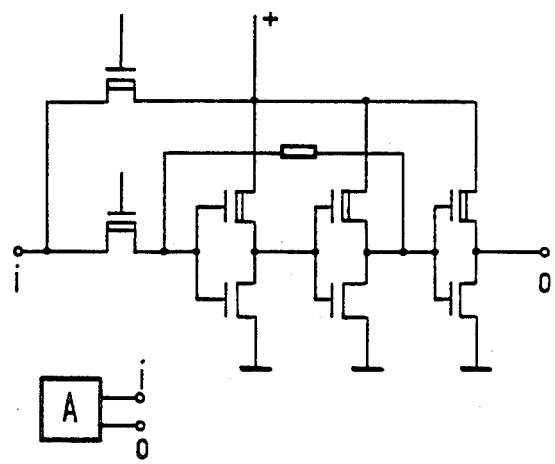
FIG. 4 is a symbolic representation contained in FIG. 1 and a fundamental circuit diagram of a regenerator (amplifier circuit) such as employed m-fold in the circuit arrangement of FIG. 1.
Figure 5:
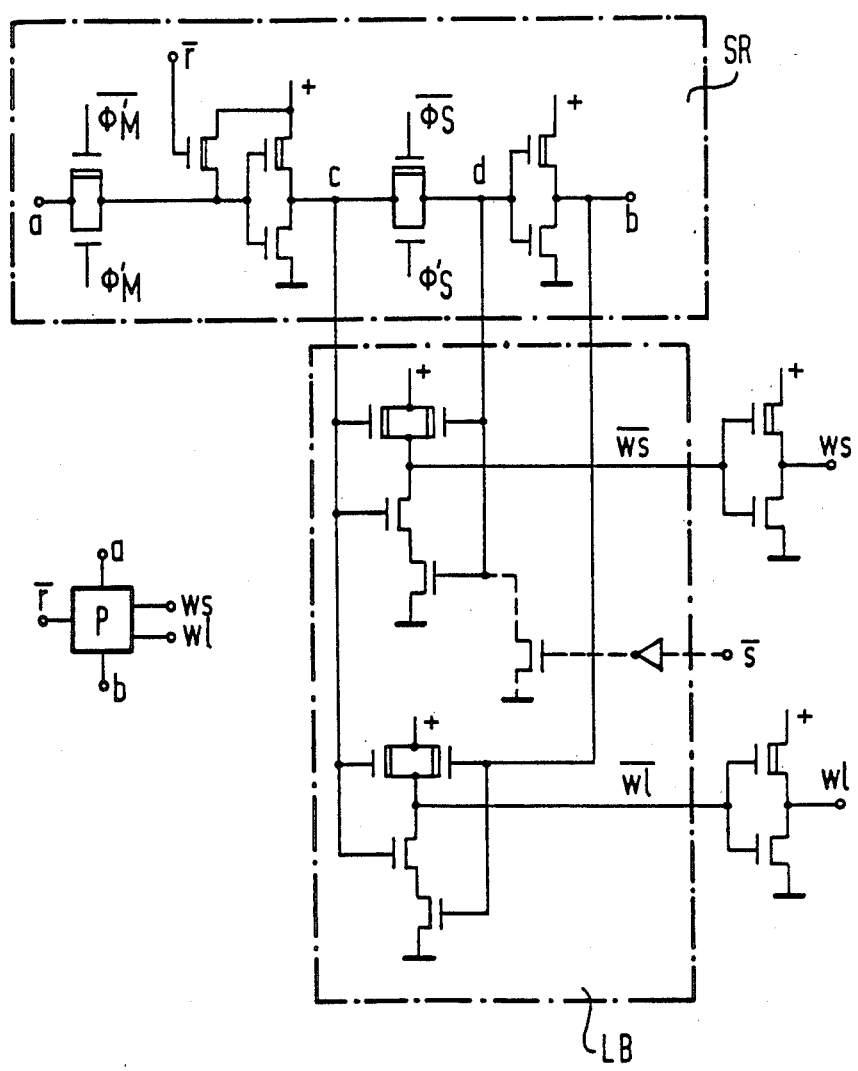
FIG. 5 is a symbolic representation employed in FIG. 1 for a row selector stage and the fundamental circuit diagram thereof, such stages being employed n-fold in the circuit arrangement of FIG. 1.

As already set forth, FIG. 4 illustrates a regenerator. The regenerator has the job of amplifying the read signal appearing attenuated on the read bit line bl assigned to its input i, amplifying the same to a normal level and emitting the same to the highly capacitively-loaded write bit line bs assigned to the output o. The circuit of this regenerator contains a three-stage inverter arrangement having a regeneration path contained therein. The inverter arrangement is preceded by a switch which, controlled by the hold signal, disconnects the inverter arrangement from the input i whenever the read bit line is precharged for the next clock cycle and thereby retains the stored information. The recharging is thereby effected by a further switch controlled by the $\overline{Precharge}$ signal.

According to an advantageous feature of the invention, the circuit arrangement illustrated in FIG. 1 can be multiply provided in accordance with the word width of the input data, whereby the word write lines ws and, respectively, word read lines wl of the memory matrices are connected in parallel and are connected to a row selector $P_O \ldots P_n$ provided in common for these memory matrices. The $\overline{Reset}$ signal which is supplied to the reset input $\overline{Reset}$ can, according to another feature of the invention, be offered with the input signals, i.e. can be derived therefrom.

Another advantageous feature of the invention provides that the $\overline{Reset}$ signal is internally generated in the chip comprising the circuit arrangement, being internally generated by an externally resettable cyclical counter. Advantageous, only those data outputs which are required for the respective purpose of the circuit arrangement are conducted out of the arrangement. For the sake of a type limitation, however, it is also advantageous to conduct as many outputs out of the chip as would correspond to the conceivable cases of use of the present invention. The amplifiers $A_1 \ldots A_m$ illustrated in FIG. 1 are inverting amplifiers. A differently constituted embodiment of the invention provides that the amplifiers $A_1 \ldots A_m$ are non-inverting but that, accordingly, a respective inverter is provided at every second data output of the circuit arrangement.

According to another feature of the invention, the row selector $P_1 \ldots P_n$ is respectively composed of a shift register, of a logic block and of two output drivers having outputs ws and, respectively, wl per element of the row selector, and that the phase relations and pulse widths of the output signals in the outputs ws and wl are effected by corresponding logic combinations of the three taps existing in the shift register.

As already mentioned above, FIG. 5 illustrates a row selector stage P. Two dynamic register stages which can be separated from one another or, respectively, from the signal input a by switches controlled with the assistance of auxiliary clocks $\phi'_M$, $\overline{\phi}'_M$; $\phi_S$, $\overline{\phi}_S$ are provided in a shift register block SR. The auxiliary clocks $\overline{\phi}_M$ and $\phi_M$ corresponding to the auxiliary clocks $\overline{\phi}_M$ and $\overline{\phi}_M$ of FIG. 2. However, they represent result signals of the logic operation of the appertaining signals illustrated in FIG. 2 with the reset signal. This logic operation effects a closing of the switch at the input of the shift register block SR for the duration of the reset signal. Two logic elements are provided in a logic block LB, these logic elements combining the signals appearing at the points c, d, b with one another in accordance with the functions:

$\overline{ws} = \overline{c \wedge d}$ ; and $\overline{wl} = \overline{c \wedge d}$.

The output signals $\overline{ws}$ and $\overline{wl}$ of the logic block B are connected via inverting drivers to the word write line ws or, respectively, to the word read line wl of the appertaining row of the matrix-shaped memory arrangement. A respective reset input r̄ is provided for the stages $P_2 \ldots P_n$ of the row selector according to FIG. 1. This is replaced at the stage $P_1$ at the setting input s̄, as indicated with broken lines in FIG. 5.

Based on its structure, the circuit arrangement of the present invention is particularly suited for realization as a monolithically integrated MOS circuit.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A circuit arrangement for providing a variably adjustable time delay for a data stream of digital signals, comprising:
   a memory matrix including a plurality of storage elements arranged in columns and rows, each of said storage elements comprising a three-transistor cell having overlapping write/read cycles, a separate write bit line and a separate read bit line for each column respectively connected to each cell of the respective column, and a separate write word line and a separate read word line for each row respectively connected to each cell of the respective row;
   a reset control signal input for receiving a reset control signal;
   a continuously steppable clocked row selector including a plurality of cascaded selector stages each including two mutually offset signal outputs respectively connected to a respective write word line and a respective read word line and each including a control input connected to said reset control signal input for receiving a reset signal at an arbitrary time for setting the first stage and resetting all other stages of said row selector;
   an undelayed data output and a plurality of delayed data outputs;
   a data input for receiving an input data stream to be delayed, said data input connected to said write bit line of a first of said columns and to said undelayed data output; and
   a plurality of amplifiers each assigned to a respective column including an input connected to a respective read bit line of the respective column and an output connected to a respective delayed data output and to said bit write line of the adjacent column,
   the spacing between reset signals selected to be equal to the desired delay between said undelayed data output and the delay output of the first column.

2. The circuit arrangement of claim 1, and further comprising:
   a plurality of said memory matrices with said word and bit lines connected in parallel and connected in common with said row selector.

3. The circuit arrangement of claim 1, and further comprising:
   an adjustable cyclical counter receiving said input data stream and producing said reset signal.

4. The circuit arrangement of claim 1, wherein:
   each of said amplifiers is an inverting amplifier.

5. The circuit arrangement of claim 1, and further comprising:
   a plurality of inverters each interposed between a respective amplifier output and the respective write bit line and the respective data output.

6. The circuit arrangement of claim 1, wherein:
   said circuit arrangement is a monolithically integrated metal-oxide-semiconductor circuit.

7. The circuit arrangement of claim 1, wherein:
   said row selector comprises a shift register in which each selector stage comprises a shift register stage having three taps and a logic block connected to said three taps and a logic block connected to said three taps to logically combine signals thereat for the respective write word line and the respective read word line.

* * * * *